United States Patent
Schultz et al.

(10) Patent No.: US 10,305,511 B1
(45) Date of Patent: May 28, 2019

(54) RUN LENGTH COMPRESSION AND DECOMPRESSION USING AN ALTERNATIVE VALUE FOR SINGLE OCCURRENCES OF A RUN VALUE

(71) Applicant: Xilinx, Inc., San Jose, CA (US)

(72) Inventors: David P. Schultz, Longmont, CO (US); Weiguang Lu, San Jose, CA (US); Priyanka Agrawal, San Jose, CA (US); Jun Liu, San Jose, CA (US); Sourabh Goyal, Cupertino, CA (US); David Robinson, Loanhead (GB)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/990,151

(22) Filed: May 25, 2018

(51) Int. Cl.
*H03M 7/46* (2006.01)
*G06F 17/50* (2006.01)

(52) U.S. Cl.
CPC ........... *H03M 7/46* (2013.01); *G06F 17/5045* (2013.01)

(58) Field of Classification Search
CPC ......... H03M 7/6058; H03M 7/60; H03M 7/30
USPC .................................. 341/50, 51, 69, 63, 65
See application file for complete search history.

(56) References Cited

U.S. PATENT DOCUMENTS

| | | | |
|---|---|---|---|
| 6,906,936 B1 * | 6/2005 | James | G11C 15/00 365/189.07 |
| 7,103,685 B1 | 9/2006 | Trimberger | |
| 7,482,954 B1 | 1/2009 | Trimberger | |
| 7,719,447 B2 * | 5/2010 | Ohashi | H03M 7/425 341/51 |
| 7,830,171 B1 | 11/2010 | New | |
| 8,077,776 B1 | 12/2011 | Lo | |
| 8,270,742 B1 | 9/2012 | Lee | |
| 8,483,500 B2 * | 7/2013 | Nguyen | H03M 7/3082 382/232 |
| 10,033,404 B2 * | 7/2018 | Cutter | H03M 7/40 |

* cited by examiner

*Primary Examiner* — Peguy Jean Pierre
(74) *Attorney, Agent, or Firm* — LeRoy D. Maunu

(57) ABSTRACT

Decompressing a data set includes inputting data units to a decompression circuit and comparing each input data unit to a run value and to a substitute value. In response to the data unit being not equal to the run value or the substitute value, the decompression circuit outputs the value of the input data unit; in response to the input data unit having the run value and a succeeding data unit having a value N not equal to zero or one, the decompression circuit outputs multiple data units having the run value based on the value N; in response to input data unit having the substitute value, the decompression circuit outputs one data unit having the run value; and in response to one input data unit having the run value and a succeeding data unit equal to zero or one, the decompression circuit outputs one data unit of the substitute value.

20 Claims, 6 Drawing Sheets

RUN LENGTH COMPRESSION AND DECOMPRESSION USING AN ALTERNATIVE VALUE FOR SINGLE OCCURRENCES OF A RUN VALUE

TECHNICAL FIELD

The disclosure generally relates to compression of a data set using an alternative value for single occurrences of the run value.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Configuration bitstreams have grown larger with each new generation of programmable ICs. The number of memory cells and amount of logic circuitry implemented on a chip or in an IC package continues to grow, allowing larger circuit designs, which require larger configuration bitstreams.

Large configuration bitstreams may be problematic. In order to reduce the time to boot a programmable IC, a configuration bistream can be stored on-chip or within the same package as the programmable logic circuitry, thereby reducing the time needed for configuration circuitry to retrieve the bitstream. However, providing on-chip or in-package storage for the configuration bitstream may require a large memory device and enlarge the footprint and cost of the device. Alternatively, a configuration bitstream can be stored off-chip or off-package to reduce device storage requirements. However, loading a large configuration bitstream from an external source may increase the boot time to an unacceptable duration.

SUMMARY

A method of decompressing a data set includes inputting a plurality of input data units of the data set to a decompression circuit and comparing a value of each input data unit of the plurality of input data units to a run value and to a substitute value. In response to detecting a value other than the run value and the substitute value, the decompression circuit outputs the value of each input data unit; in response to detecting the input data unit having the run value and a succeeding input data unit having a value N that is not equal to zero or one, the decompression circuit outputs a plurality of data units having the run value, wherein the plurality is based on the value N; in response to detecting the input data unit having the substitute value, the decompression circuit outputs one data unit having the run value; and in response to detecting one input data unit having the run value and a succeeding input data unit equal to zero or one, the decompression circuit outputs one data unit of the substitute value.

A circuit arrangement includes a first register configured with a run value, a second register configured with a substitute value, and a third register configured to input a data unit. A compare circuit is coupled to receive output of the first, second, and third registers, and the compare circuit is configured to compare a value of the data unit to the run value and to the substitute value, and output one or more signals indicative of a run value match or a substitute value match. An output value generation circuit is coupled to receive the one or more signals from the compare circuit and is configured to output the value of the data unit in response to the one or more signals indicating a value other than the run value and the substitute value. The output value generation circuit is configured to output a plurality of data units having the run value in response to the one or more signals indicating a match to the run value and a succeeding data unit having a value N, wherein the plurality is based on the value N. The output value generation circuit is configured to output one run value data unit in response to the one or more signals indicating a match to the substitute value. The output value generation circuit is configured to output the substitute value in response to the one or more signals indicating matches to one run value and a succeeding data unit equal to zero or one.

A method of compressing a data set includes inputting a plurality of input data units of the data set to a compression circuit. The compression circuit compares a value of each input data unit of the plurality of input data units to a run value and to a substitute value. In response to detecting an input data unit having value other than the run value and the substitute value, the compression circuit outputs the value of input data unit; in response to detecting a plurality of successive input data units having the run value, for N 1, the compression circuit outputs one data unit having the run value and a succeeding data unit having a value N; in response to detecting one input data unit having the run value and a succeeding input data unit having a value other than the run value, the compression circuit outputs one data unit having the substitute value; and in response to detecting the input data unit having the substitute value, the compression circuit outputs one data unit having the run value and a succeeding input data unit equal to zero or one.

Other features will be recognized from consideration of the Detailed Description and Claims, which follow.

BRIEF DESCRIPTION OF THE DRAWINGS

Various aspects and features of the methods and circuits will become apparent upon review of the following detailed description and upon reference to the drawings in which.

generation circuit outputs one data unit having the substitute value.

Figure 6:
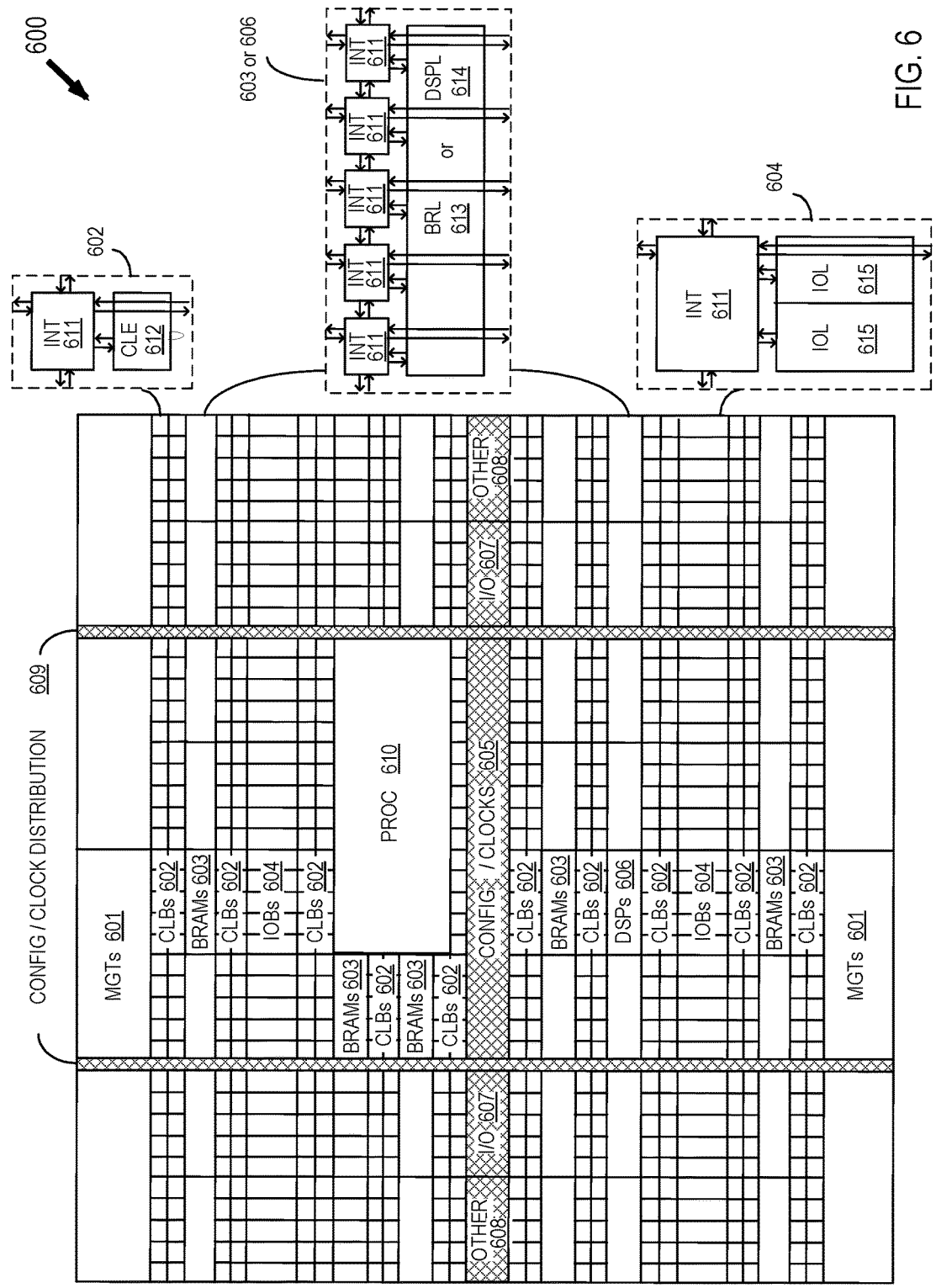
Figure 7:
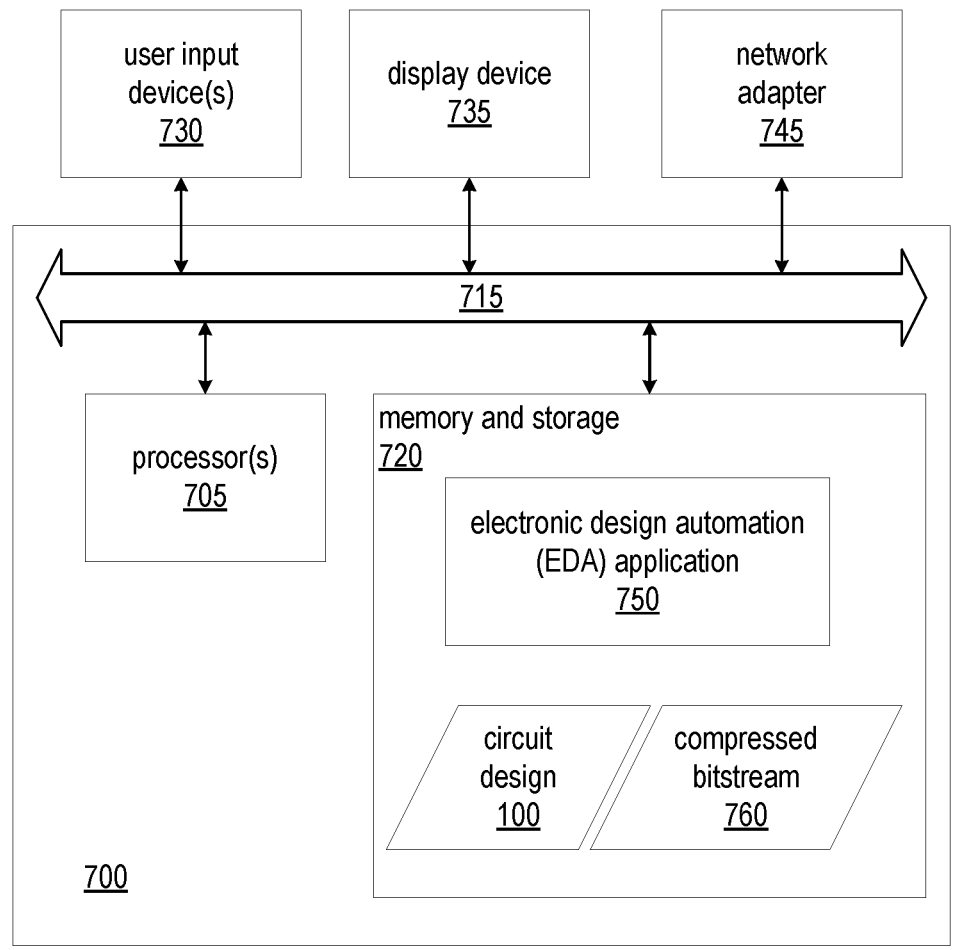

FIG. 6 shows a programmable integrated circuit (IC) 600 on which the disclosed circuits and processes may be implemented; and FIG. 7 is a block diagram illustrating an exemplary data processing system.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

For ease of explanation, the following description assumes 8-bit, byte-size data units. Referenced values are assumed to occupy one byte. Those skilled in the art will recognize that the disclosed approaches can be applied to data units of any size, including for example, and without limitation, data units having 2, 4, 8, or 16 bytes. The following description also assumes for ease of explanation that the "run value" being compressed is a 0 value. The run value is a series of two or more consecutive data units of equal value in the uncompressed data. Depending on the data set being compressed, the run value being compressed can be a value other than 0. For example, some applications may include the hexadecimal value FF (denoted, h'FF) as a pad value, and runs of h'FF might be selected for compression. The approach may also be applicable to compressing multiple different run values as long as there are a sufficient number of different least used values that can be used as substitutes for single occurrences.

In some prior run-length encoding schemes, a run of N 0 values is compressed into a single zero value followed by the value N. According to this scheme, a single 0 value would be represented in the compressed data set as a 0 value followed by the value of 0 or 1, depending on how 0 values are counted. Thus, each single 0 value would be represented by two values in the compressed data set, which can greatly reduce the effectiveness of the compression depending on the frequency of single occurrence 0 values in the source data set.

In the disclosed approaches, a single byte of the run value being compressed is represented by a single byte of some value other than the run value. The value chosen to represent single occurrences of the run value is a value that has been observed to occur infrequently in the data set. Thus, instead of requiring two data units to represent a single occurrence of the run value, each single occurrence of the run value can be represented by a single occurrence of a substitute value. Each occurrence of the substitute value of the uncompressed data set can be replaced by one run value and a succeeding value of 0 or 1. For example, for a run value 0, the substitute value can be represented in the compressed data set as the value 0 followed by another value 0. As long as the substitute value does not occur too frequently in the uncompressed data set, the savings realized by compressing the run values will not be outweighed by representing the substitute value by two bytes in the compressed data set.

As an example involving a run value h'00 and a substitute value h'FD, the following data set can be compressed:

9C 23 00 00 00 00 0A 7B 3C 00 01 FD 4F D1

The resulting compressed data can be:

9C 23 00 03 0A 7B 3C FD 01 00 00 4F D1

The compression shows that the run of four data units having values h'00 are compressed to 00 03. The single occurrence of h'00 is replaced with the substitute value h'FD, and the substitute value h'FD is replaced by 00 00.

Figure 1:
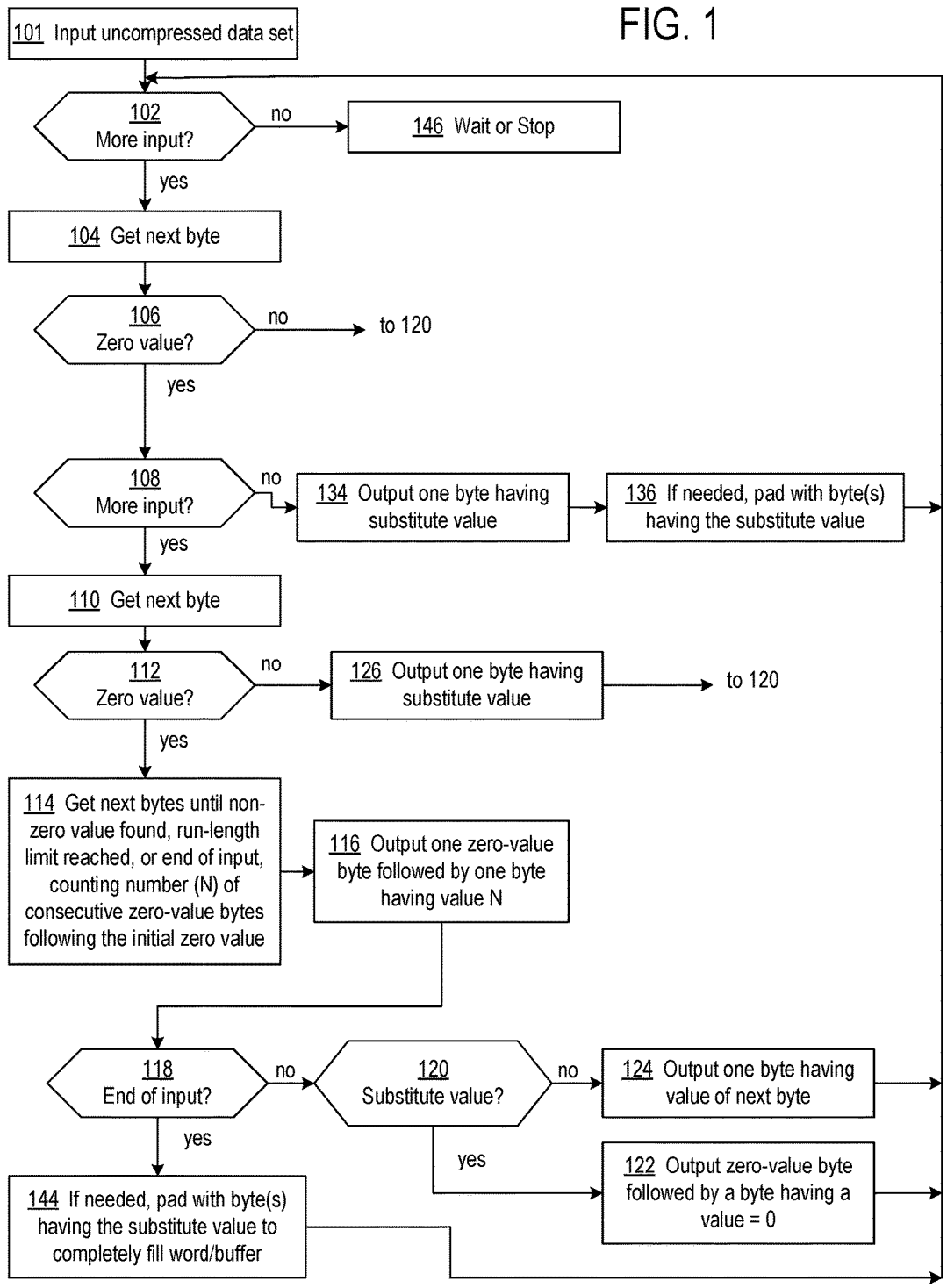
FIG. 1 shows a flowchart of an exemplary process for compressing a data set in which a substitute value is used to represent a single occurrence of the run value.

FIG. 1 shows a flowchart of an exemplary process for compressing a data set in which a substitute value is used to represent a single occurrence of the run value. At block 101, an uncompressed data set of multiple bytes is input. The uncompressed data set can be input to a dedicated compression circuit or to a computer system specifically programmed to compress an input data set for a particular application according to the process of FIG. 1. Decision block 102 is a control for iterative processing over the bytes of the uncompressed data.

If the uncompressed data set has more bytes to compress, the next byte is retrieved at block 104. Decision block 106 tests whether the retrieved byte is equal to the run value, h'00. In response to encountering the exemplary run value h'00, the process proceeds to determine whether the initial occurrence is a single occurrence of the run value or the initial occurrence is followed by one or more successive occurrences of the run value in the uncompressed data set. The initial occurrence of the run value might be the last byte of the uncompressed data set, and decision block 108 checks whether more uncompressed data follows the initial run value. If more uncompressed data follows, the next byte of uncompressed data is retrieved at block 110. Decision block 112 determines whether the retrieved byte has the run value h'00. In response to two successive run values h'00, the process proceeds to block 114, at which the process retrieves succeeding bytes until a non-run value is found, a run-length limit is reached, or until there is no more uncompressed data to process, and counts the number of successive occurrences of the run value following the initial occurrence. The run-length limit can be set in a configurable register to indicate the maximum number of run values that can be compressed in a run. For example, if 8-bit bytes of zero values are being compressed, the run-length limit can be set to 256. At block 116, the process outputs a byte having the run value h'00 followed by a count value, which indicates the number of occurrences of the run value h'00 that followed the initial occurrence of the run value. In an alternative embodiment, the count can include the initial occurrence and the number of the occurrences of the run value that followed the initial occurrence.

Decision block 118 determines if there is more uncompressed data to process. If there is more uncompressed data, decision block 120 determines whether the next byte at the end of the sequence of run values h'00 is equal to the substitute value. If the substitute value is at the end of the sequence of run values, at block 122 the process outputs one byte of the run value h'00 followed by h'00. In an alternative embodiment, the substitute value can be replaced by one byte of the run value h'00 followed by h'01. Block 124 outputs one byte having the value of the next byte that terminated the sequence of run values if a value other than the substitute value terminated the sequence. After blocks 122 and 124, the process continues at block 102 to process more input data. If at decision block 118 the process finds that the end of the input data set has been reached, at block 144, pad bytes having the substitute value are output, such as to completely fill a data word or buffer if the compressed data does not completely fill the target register or buffer.

If the process finds at decision block 112 that the initial occurrence of the run value h'00 is not followed in succession by another run value, the process continues at block 126, at which one byte having the substitute value is output to represent in the output compressed data set the single occurrence of the run value in the uncompressed data set.

The processing then continues at decision block 120 to handle the non-run-value byte that followed the initial occurrence of the run value. If the non-run-value byte is not equal to the substitute value, block 124 outputs one byte having the non-run-value. If the non-run-value byte is equal to the substitute value, block 122 outputs a zero-value byte followed by h'00. In an alternative embodiment, the substitute value can be replaced by one byte of the run value h'00 followed by h'01. After blocks 122 and 124, the process continues at block 102 to process more input data.

If the process finds at decision block 108 that a single occurrence of the run value is at the end of the input uncompressed data set, at block 134 one byte having the substitute value is output. If pad bytes are needed, such as to completely fill a data word, a desired number of bytes having the substitute value are output at block 136. For example, if the last byte of compressed data occupies byte 0 of a 64-bit word having 8, 8-bit bytes, the substitute value can be output for the remaining bytes 1-7 to complete a 64-bit word. Multiple bytes of the substitute value are used as padding, because two consecutive substitute values cannot represent valid data in the compressed data set. A single occurrence of the substitute value in the compressed data set represents a single occurrence of the run value, and if consecutive substitute values were to represent valid data, consecutive substitute values would represent consecutive run values. However, consecutive run values are represented in the compressed data set by a single run value followed by a count value. Consecutive run values cannot be represented in two different ways in the compressed data set.

If the byte retrieved at block 104 is not equal to zero, decision block 106 directs the process to decision block 120. Decision block 120 checks whether the value of the byte from the uncompressed data set is equal to the substitute value. If the value of the byte from the uncompressed data set is equal to the substitute value, at block 122 the process outputs a zero-value byte followed by h'00. In an alternative embodiment, the substitute value can be replaced by one byte of the run value h'00 followed by h'01. If the value of the byte from the uncompressed bitstream is not equal to the substitute value, block 124 outputs one byte having the non-run-value. After blocks 122 and 124, the process continues at block 102 to process more input data. If decision block 102 finds that there is no more uncompressed data to process, at block 146 the process waits for more uncompressed data to become available or stops processing, depending on the application.

In one implementation, the substitute value can be determined based on analysis of the input uncompressed data set. For example, prior to decision block 102, the input data set can be scanned, counting the number of times each value occurs in the data set. The value having the least number of occurrences can then be used as the substitute value, and the substitute value can be provided as a configuration parameter to the decompression circuitry.

Figure 2:
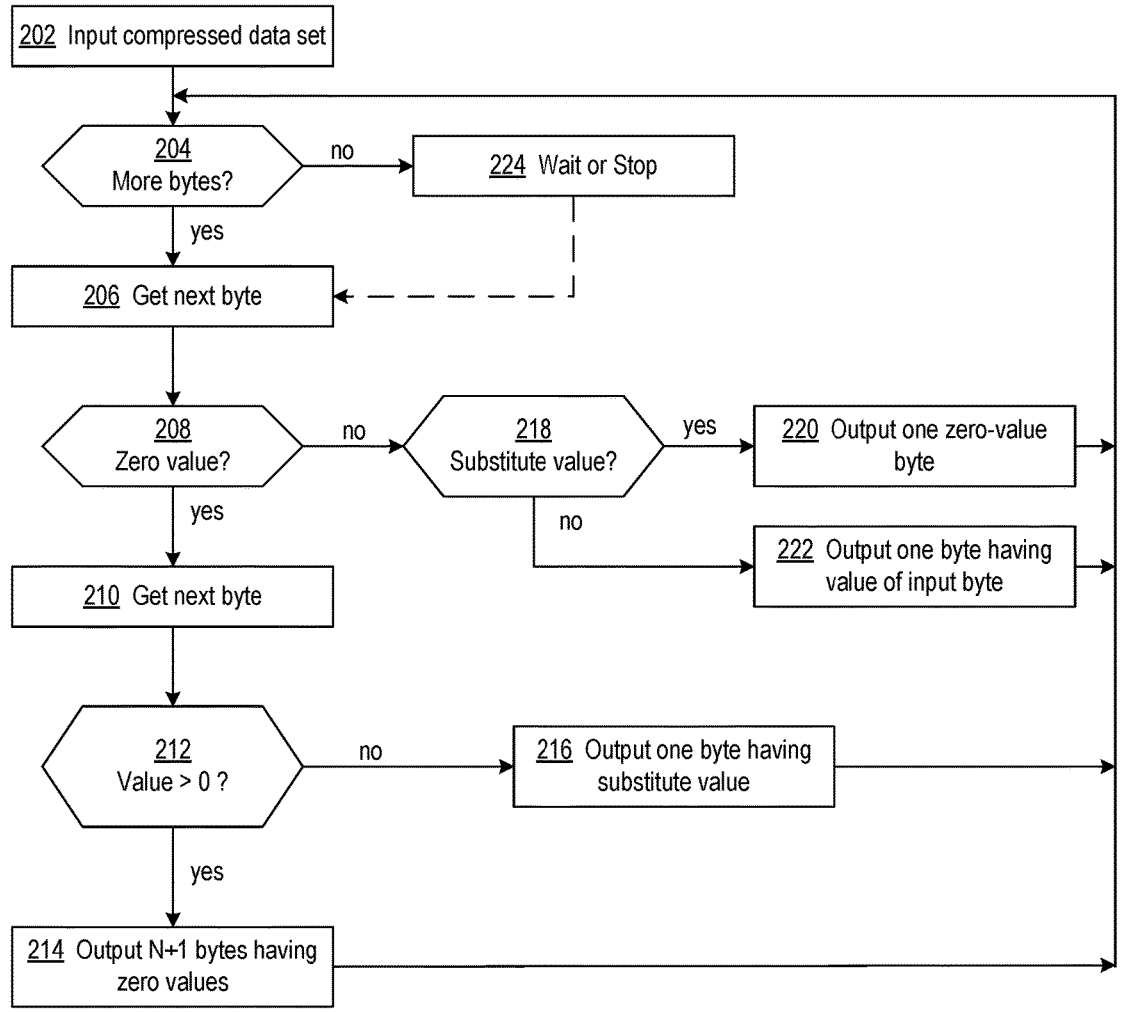
FIG. 2. shows a flowchart of an exemplary process for decompressing a data set in which a substitute value is used to represent a single occurrence of the run value.

FIG. 2. shows a flowchart of an exemplary process for decompressing a data set in which a substitute value is used to represent a single occurrence of the run value. At block 202, a compressed data set is input. The compressed data set can be input to a dedicated decompression circuit or to a computer system specifically programmed to decompress an input data set for a particular application according to the process of FIG. 2. Decision block 204 is a control for iterative processing over the bytes of the compressed data. The end of compressed data can be indicated by there being no more data to process or by byte values that indicate padding of the input data set.

If the compressed data set has more bytes to decompress, the next byte is retrieved at block 206. Decision block 208 tests whether the retrieved byte is equal to the run value, which in the exemplary flowchart is the value 0 and denoted herein as hexadecimal 00 (h'00). If the retrieved byte is the run value h'00, the next byte is retrieved at block 210, and decision block 212 determines whether the next byte has a value N that is not equal to zero. A zero-value byte followed by a byte having a value greater than 0 indicates a run of zero-value bytes, and the non-zero value is a count value. At block 214, N+1 zero-value bytes are output. N+1 zero-value bytes are output, rather than N zero-value bytes, due to the manner in which the compression algorithm counts the number of successive zero-value. The compression algorithm can count either the number of bytes having zero values that follow an initial zero value and store that count as the number of bytes of zero values. Alternatively, the compression algorithm can count the initial byte having the zero value and the number of bytes having zero values that follow the initial zero value byte and store that count as the number of bytes having zero values. N+1 bytes of zero values are output if the initial zero value byte is not counted, and N bytes of zero values are output if the initial zero value byte is counted. The process then continues at block 204 to process more input data.

If decision block 212 finds that the value of the byte that follows the initial zero-value byte is not greater than 0, one byte of the substitute value is output at block 216. In other words, in the input compressed data, a single occurrence of the run value followed by a value of 0 is decompressed into the substitute value. In an alternative implementation, the compression algorithm can represent the substitute value as a zero-value byte followed by a byte having the value '8h01 if the initial zero-value byte is counted in the run length. The process then continues at block 204 to process more input data.

If decision block 208 finds that the byte obtained at block 206 is not equal to zero (not the run value), decision block 218 determines whether the byte is equal to the substitute value. An occurrence of the substitute value in the compressed input data set is replaced with one zero-value byte in the decompressed data set at block 220. The process then continues at block 204 to process more input data.

If decision block 218 determines that the byte is not equal to the substitute value, block 222 outputs one byte having the same value as the input byte. The process then continues at block 204 to process more input data. If decision block 204 finds that there are no more bytes of compressed data to process, at block 224 the process waits for more compressed data to become available or stops processing, depending on the application.

At all output blocks in FIG. 2, the output of the byte values can be to an application-specific destination. For example, the decompressed data set can be stored in a local RAM, output as a data stream such as for audio and/or video/image applications, or temporarily stored in a buffer, such as for storing the decompressed data in a configuration memory of a programmable IC. In an implementation in which the decompressed data is temporarily stored in a buffer before storing to the configuration memory of a programmable IC, the outputting of the decompressed data will be suspended when the buffer is full and will wait for the decompressed data in the buffer to be stored in the configuration memory before resuming output of data and performing further decompression operations.

In some implementations, the substitute value can be changed based on different data sets. For example, a configuration register can be dedicated to storing the substitute value, and the value can be changed in the configuration register when different data sets have different infrequently occurring values.

Figure 3:
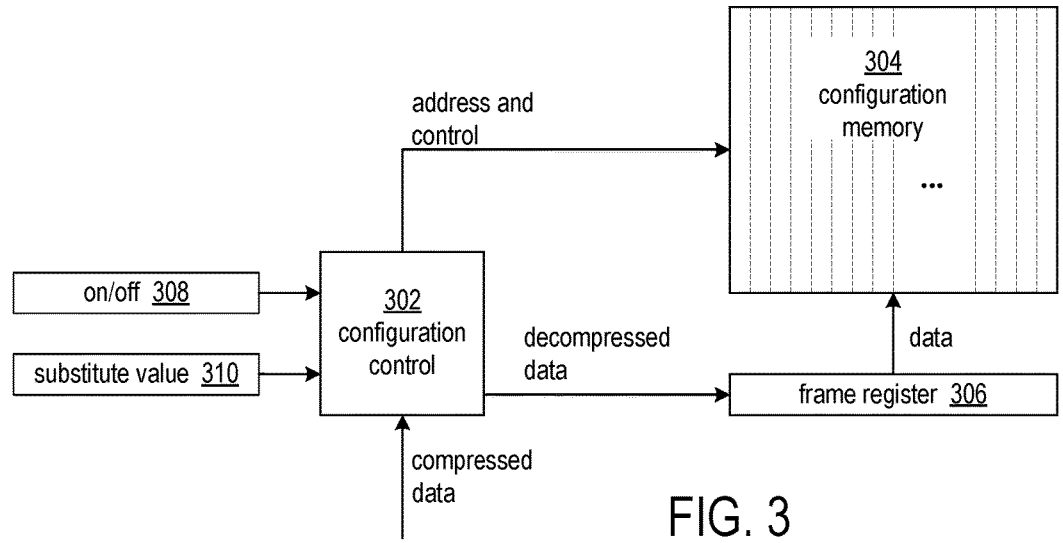
FIG. 3 shows a circuit arrangement in which the decompression algorithm of FIG. 1 can be used.

FIG. 3 shows a circuit arrangement in which the decompression algorithm of FIG. 2 can be used. The circuit arrangement includes a configuration control circuit 302, which can be implemented as hardwired logic or as a microprocessor. The configuration control circuit decompresses input compressed data and controls the storage of decompressed data in the configuration memory 304. The configuration memory can be for programming programmable circuitry of a programmable IC, for example. In an exemplary implementation, the configuration memory can be organized as having multiple addressable frames, which are illustrated by the columns between the vertical dashed lines. The contents of the frame register 306 program one frame of the configuration memory.

The configuration control circuit 302 decompresses the input compressed data consistent with the decompression algorithm shown in FIG. 2 and writes decompressed data to the frame register 306. Once the frame register is full, the configuration control circuit 302 addresses the configuration memory and enables writing data from the frame register to the configuration memory. Once the data from the frame register has been written to the configuration memory 304, the configuration control circuit can resume decompression and filling the frame register. Decompression can be turned on or off by storing a value in the control register 308. The value in the control register can be changed to turn on decompression for applications in which compressed data is desirable or to turn off decompression for applications in which compression is not used. The substitute value used in the compressed input data can be indicated by control register 310. As different values may be the least frequently occurring values in different applications, the programmable control register 310 allows the same type of device to be used in a variety of applications. One or both of the control register 308 and 310 can be implemented by non-volatile memory circuits such as nonvolatile SRAM (nvSRAM), ferroelectric RAM, electrically erasable programmable ROM (EEPROM), flash memories, or e-fuses, for example.

Figure 4:
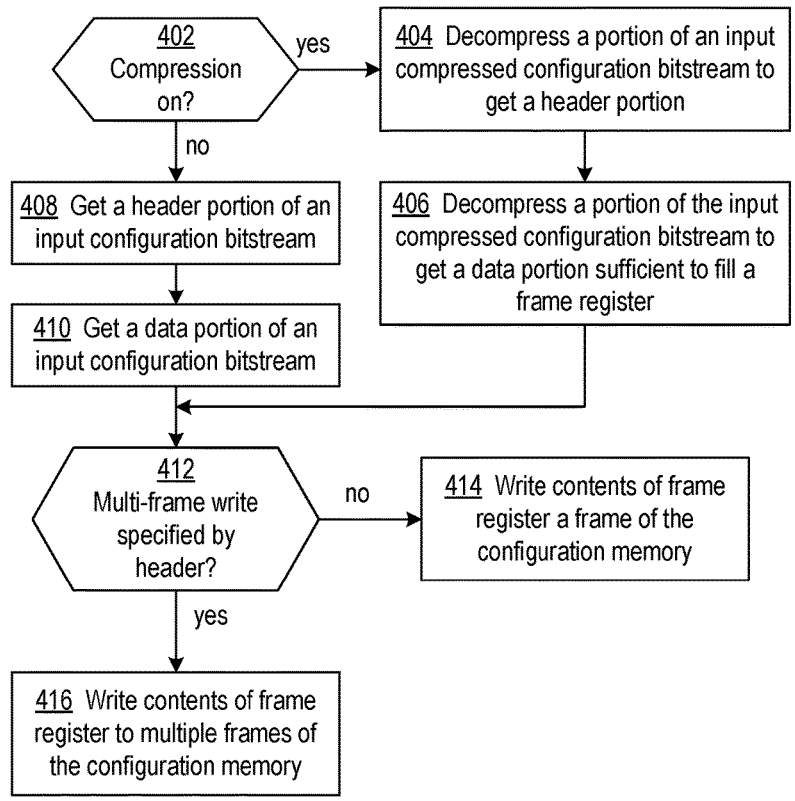
FIG. 4 shows a flowchart of a process that combines the disclosed decompression process with multi-frame write (MFW) of configuration data to the configuration memory of a programmable IC.

FIG. 4 shows a flowchart of a process that combines the disclosed decompression process with multi-frame write (MFW) of configuration data to the configuration memory of a programmable IC. MFW is a feature by which the same data in the frame register is written to multiple frames in the configuration memory. The MFW feature can significantly reduce both the size of a configuration bitstream and the time required to load the configuration bitstream and program the configuration memory. The process of FIG. 4 can be performed by the configuration control circuit 302 of FIG. 3, for example.

At block 402, the configuration control circuit checks whether compression is on or off. If compression is on, at block 404 the configuration control circuit decompresses a portion of the input configuration bitstream to obtain a header portion. The header can specify whether MFW is specified.

At block 406, the configuration control circuit decompresses data from the configuration bitstream, filling the frame register with the decompressed data. If compression is not turned on, at block 408, the configuration control circuit inputs the header of the configuration bitstream, and at block 410, inputs the data portion of the configuration bitstream.

At decision block 412, the configuration control circuit checks whether the header specifies a MFW command. If so, at block 414 the configuration control circuit writes the contents of the frame register to the specified number of frames. Otherwise, at block 416, the configuration control circuit writes the contents of the frame register to the configuration memory and repeats the process of decompressing input data, filling the frame register, and writing the contents from register to the configuration memory until the end of the configuration bitstream is reached.

Figure 5:
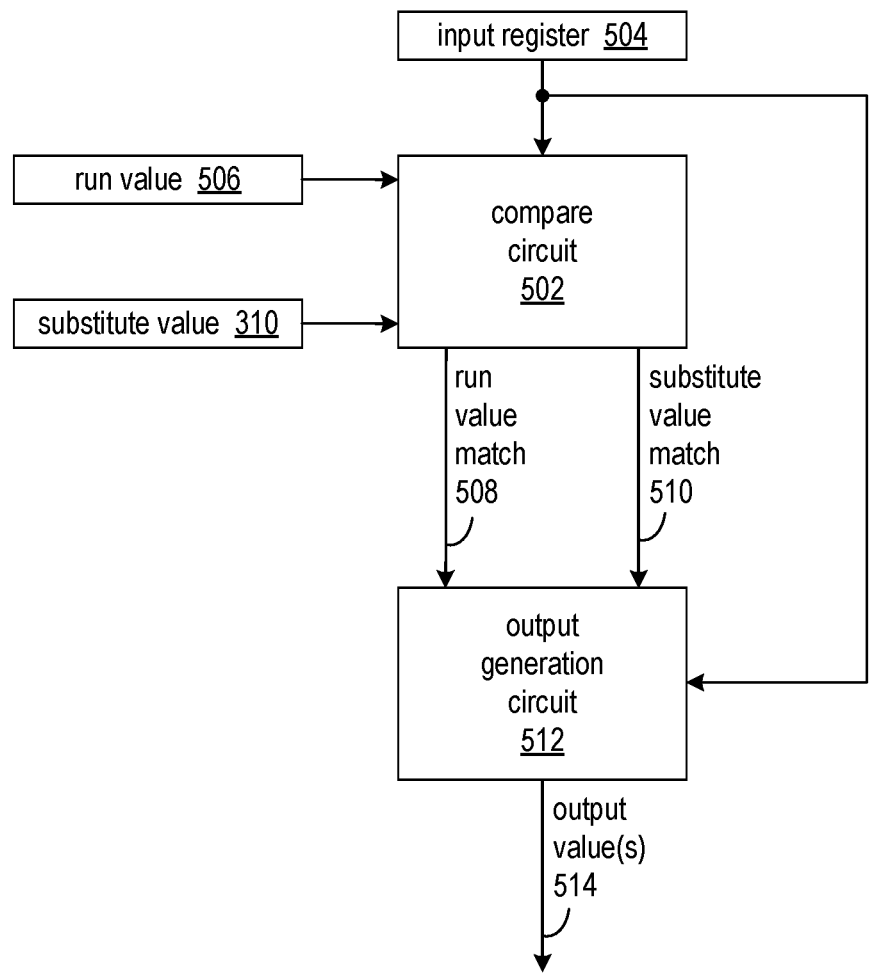
FIG. 5 shows an exemplary circuit that decompresses an input data stream consistent with the process of FIG. 1.

FIG. 5 shows an exemplary circuit that decompresses an input data stream consistent with the process of FIG. 2. The compare circuit 502 inputs a data unit from input register 504 and compares the value of the input data unit to the run value in control register 506 and the substitute value in register 310. Signal 508 is asserted in response to the value of the input data matching the run value, or signal 510 is asserted in response to the value of the input data unit matching the substitute value. The compare circuit 502 and output generation circuit 512 can be implemented as part of the configuration control circuit 302 of FIG. 3.

In response to the states of the signals 508 and 510, the output generation circuit 512 generates and outputs an output value 514. The output generation circuit outputs the value of the data unit in response to signal 508 indicating no match to the run value and signal 510 indicating no match to the substitute value. The output generation circuit outputs multiple data units having the run value in response to signal 508 indicating a match to the run signal for one input data unit and signal 508 indicating no match for the succeeding data unit. The number of data units having the run value and output in succession is based on the value of the succeeding data unit. In response to signal 510 indicating a match between the values of the input data unit and the substitute value, the output generation circuit outputs one data unit having the run value. In response to signal 508 indicating a match between the value of a data unit and the run value, and the value of the succeeding data unit equal to zero or 1, the output generation circuit outputs one data unit having the substitute value.

FIG. 6 shows a programmable integrated circuit (IC) 600 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 6 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. The configuration and clocking logic can implement the configuration and control circuitry in an exemplary implementation. Some programmable IC having FPGA logic also include dedicated processor blocks (PROC) 610 and internal and external reconfiguration ports (not shown).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

A columnar area near the center of the die (shown shaded in FIG. 6) is used for configuration, clock, and other control logic. Horizontal areas 609 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 6 include additional logic blocks that disrupt the regular columnar structure making up a large part of the programmable IC. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual programmable IC, more than one adjacent column of CLBs is typically included wherever the CLBs appear, to facilitate the efficient implementation of user logic.

FIG. 7 is a block diagram illustrating an exemplary data processing system (system) 700. System 700 is an example of an EDA system. As pictured, system 700 includes at least one processor circuit (or "processor"), e.g., a central processing unit (CPU) 705 coupled to memory and storage arrangement 720 through a system bus 715 or other suitable circuitry. System 700 stores program code and circuit design 100 within memory and storage arrangement 720. Processor 705 executes the program code accessed from the memory and storage arrangement 720 via system bus 715. In one aspect, system 700 is implemented as a computer or other data processing system that is suitable for storing and/or executing program code. It should be appreciated, however, that system 700 can be implemented in the form of any system including a processor and memory that is capable of performing the functions described within this disclosure.

Memory and storage arrangement 720 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 700 may also include one or more cache memories (not shown) that provide temporary storage of at least some program code and data in order to reduce the number of times program code and data must be retrieved from local memory and persistent storage during execution.

Input/output (I/O) devices such as user input device(s) 730 and a display device 735 may be optionally coupled to system 700. The I/O devices may be coupled to system 700 either directly or through intervening I/O controllers. A network adapter 745 also can be coupled to system 700 in order to couple system 700 to other systems, computer systems, remote printers, and/or remote storage devices through intervening private or public networks. Modems, cable modems, Ethernet cards, and wireless transceivers are examples of different types of network adapter 745 that can be used with system 700.

Memory and storage arrangement 720 may store an EDA application 750. EDA application 750, being implemented in the form of executable program code, is executed by processor(s) 705. As such, EDA application 750 is considered part of system 700. System 700, while executing EDA application 750, receives and operates on circuit design 100. In one aspect, system 700 performs a design flow on circuit design 100, and the design flow may include synthesis, mapping, placement, routing, generation of a configuration bitstream, and compression of the configuration bitstream as described herein. System 700 generates compressed configuration bitstream 760.

EDA application 750, circuit design 100, circuit design 760, and any data items used, generated, and/or operated upon by EDA application 750 are functional data structures that impart functionality when employed as part of system 700 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The methods and circuits are thought to be applicable to a variety of systems for decompressing and compressing data. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method of decompressing a data set, comprising:
inputting a plurality of input data units of the data set to a decompression circuit;
comparing a value of each input data unit of the plurality of input data units to a run value and to a substitute value;
outputting the value of each input data unit in response to detecting a value other than the run value and the substitute value;
outputting a plurality of data units having the run value in response to detecting the input data unit having the run value and a succeeding input data unit having a value N that is not equal to zero or one, wherein the plurality is based on the value N;
outputting one data unit having the run value in response to detecting the input data unit having the substitute value; and
outputting one data unit of the substitute value in response to detecting one input data unit having the run value and a succeeding input data unit equal to zero or one.

2. The method of claim 1, wherein the outputting the value of each input data unit, the outputting the plurality of data units having the run value, the outputting one data unit having the run value, and the outputting one data unit of the substitute value form a decompressed data set, and the method further comprising:
filling a frame register with a portion of the decompressed data set;
storing data from the frame register in configuration memory of a programmable integrated circuit (IC); and
repeating the filling of the frame register and the storing the data in the programmable IC.

3. The method of claim 2, further comprising:
detecting a multi-frame write command in the decompressed data set; and
wherein the storing data from the frame register in the configuration memory includes storing the same data from the frame register in multiple frames of the configuration memory.

4. The method of claim 1, wherein the substitute value occurs less frequently than other values from the outputting the value of each input data unit, the outputting the plurality of data units having the run value, and the outputting the one data unit having the run value.

5. The method of claim 4, further comprising reading the substitute value from a reprogrammable register by the decompression circuit prior to the comparing.

6. The method of claim 1, wherein the run value is equal to 0.

7. The method of claim 1, wherein each data unit is one byte, and the run value is equal to 0.

8. A circuit arrangement comprising:
a first register configured with a run value;
a second register configured with a substitute value;
a third register configured to input a data unit;
a compare circuit coupled to receive output of the first, second, and third registers and configured to:
comparing a value of the data unit to the run value and to the substitute value, and
output one or more signals indicative of a run value match or a substitute value match; and
an output value generation circuit coupled to receive the one or more signals from the compare circuit and configured to:
output the value of the data unit in response to the one or more signals indicating a value other than the run value and the substitute value;
output a plurality of data units having the run value in response to the one or more signals indicating a match to the run value and a succeeding data unit having a value N, wherein the plurality is based on the value N;
output one run value data unit in response to the one or more signals indicating a match to the substitute value; and
output the substitute value in response to the one or more signals indicating matches to one run value and a succeeding data unit equal to zero or one.

9. The circuit arrangement of claim 8, wherein the output of the value of each input data unit, the output of the plurality of data units having the run value, the output of one data unit having the run value, and the output of one data unit of the substitute value form a decompressed data set, and the output value generation circuit is further configured to:
fill a frame register with a portion of the decompressed data set;
store data from the frame register in configuration memory of a programmable integrated circuit (IC); and
repeat the filling of the frame register and the storing the data in the programmable IC.

10. The circuit arrangement of claim 9, further comprising:
a configuration control circuit configured to detect a multi-frame write command in the decompressed data set; and
wherein the output value generation circuit is further configured to store the same data from the frame register in multiple frames of the configuration memory.

11. The circuit arrangement of claim 8, wherein the substitute value occurs less frequently than other values from the output of the value of each input data unit, the output of the plurality of data units having the run value, and the output of the one data unit having the run value.

12. The circuit arrangement of claim 11, wherein the first and second registers are reprogrammable.

13. The circuit arrangement of claim 8, wherein the run value is equal to 0.

14. The circuit arrangement of claim 8, wherein each data unit is one byte, and the run value is equal to 0.

15. A method of compressing a data set, comprising:
inputting a plurality of input data units of the data set to a compression circuit;
comparing a value of each input data unit of the plurality of input data units to a run value and to a substitute value;
outputting the value of each input data unit in response to detecting a value other than the run value and the substitute value;
outputting one data unit having the run value and a succeeding data unit having a value N in response to detecting a plurality of successive input data units having the run value, wherein N≥1;

outputting one data unit having the substitute value in response to detecting one input data unit having the run value and a succeeding input data unit having a value other than the run value; and outputting one data unit having the run value and a succeeding input data unit equal to zero or one in response to detecting the input data unit having the substitute value.

16. The method of claim 15, further comprising outputting a consecutive plurality of data units of the substitute value in response to detecting an end of the plurality of input data units.

17. The method of claim 15, wherein the substitute value occurs less frequently than other values in the plurality of input data units.

18. The method of claim 17, further comprising reading the substitute value from a reprogrammable register by the compression circuit prior to the comparing.

19. The method of claim 15, wherein the run value is equal to 0.

20. The method of claim 15, wherein each data unit is one byte, and the run value is equal to 0.

* * * * *